(12) United States Patent
Chen et al.

(10) Patent No.: US 10,655,628 B2
(45) Date of Patent: May 19, 2020

(54) SCALABLE FAN FRAME MECHANISM

(71) Applicant: QUANTA COMPUTER INC., Taoyuan (TW)

(72) Inventors: Chao-Jung Chen, Taoyuan (TW); Yu-Nien Huang, Taoyuan (TW); Herman Tan, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 134 days.

(21) Appl. No.: 15/994,667

(22) Filed: May 31, 2018

(65) Prior Publication Data

US 2019/0219058 A1     Jul. 18, 2019

Related U.S. Application Data

(60) Provisional application No. 62/616,634, filed on Jan. 12, 2018.

(51) Int. Cl.
    *F04D 19/00*      (2006.01)
    *F04D 29/64*      (2006.01)
    (Continued)

(52) U.S. Cl.
    CPC ......... *F04D 19/002* (2013.01); *F04D 27/002* (2013.01); *F04D 29/524* (2013.01);
    (Continued)

(58) Field of Classification Search
    CPC .... F05B 2240/14; F04D 19/002; F04D 29/60; F04D 29/64; F04D 29/646; F04D 29/325;
    (Continued)

(56) References Cited

U.S. PATENT DOCUMENTS

| 4,598,894 A * | 7/1986 | Johannes ................ F16F 1/373 |
| | | 248/615 |
| 6,921,328 B1 | 7/2005 | Nohara et al. |

(Continued)

FOREIGN PATENT DOCUMENTS

| JP | 5-99192 A | 4/1993 |
| JP | 3148042 U | 1/2009 |
| JP | 2010275907 A | 12/2010 |

OTHER PUBLICATIONS

Extended European Search Report for EP Application No. 18206961.7 dated Jun. 4, 2019.

(Continued)

*Primary Examiner* — Kenneth J Hansen
*Assistant Examiner* — Jackson N Gillenwaters
(74) *Attorney, Agent, or Firm* — Nixon Peabody LLP; Zhou Lu

(57) ABSTRACT

A cooling system for providing streamlined airflow is provided. The system includes a fan assembly that includes an inlet side and an outlet side. The fan assembly also includes an inlet fan guard connector located at the inlet side of the fan assembly and an outlet fan guard connector located at the outlet side of the fan assembly. The fan assembly also includes a lever housings located between the inlet fan guard connector and the outlet fan guard connector and a slots oriented between the lever housings and the inlet fan guard connector and the outlet fan guard connector, the plurality of slots configured to secure an additional modular component.

20 Claims, 8 Drawing Sheets

(51) Int. Cl.
*H05K 7/20* (2006.01)
*F04D 27/00* (2006.01)
*F04D 29/52* (2006.01)
*F04D 29/54* (2006.01)
*G06F 1/20* (2006.01)

(52) U.S. Cl.
CPC ......... *F04D 29/542* (2013.01); *F04D 29/646* (2013.01); *G06F 1/206* (2013.01); *H05K 7/20172* (2013.01); *H05K 7/20727* (2013.01); *H05K 7/20745* (2013.01); *H05K 7/20836* (2013.01); *F05B 2240/12* (2013.01); *F05B 2240/14* (2013.01); *F05B 2250/50* (2013.01); *G06F 2200/201* (2013.01)

(58) Field of Classification Search
CPC .... F04D 29/541; F04D 29/545; F04D 29/403; H05K 7/20172; H05K 7/20736; H05K 7/20181
See application file for complete search history.

(56) References Cited

U.S. PATENT DOCUMENTS

| | | | |
|---|---|---|---|
| 8,708,644 B2* | 4/2014 | Ma | H05K 7/20172 415/119 |
| 8,944,760 B2* | 2/2015 | Chiu | F04D 25/0613 361/679.48 |
| 9,938,990 B2* | 4/2018 | Amin-Shahidi | F04D 29/646 |
| 10,436,221 B2* | 10/2019 | Sauer | F04D 29/601 |
| 2003/0184968 A1 | 10/2003 | Steinman | |
| 2006/0221570 A1 | 10/2006 | Yang et al. | |
| 2013/0108431 A1* | 5/2013 | He | G06F 1/20 415/208.1 |
| 2014/0363286 A1* | 12/2014 | Chen | F04D 29/545 415/227 |
| 2016/0053776 A1* | 2/2016 | Williams | H05K 7/20136 361/695 |
| 2017/0114803 A1* | 4/2017 | Miwa | H05K 7/20172 |
| 2018/0080479 A1* | 3/2018 | Yang | F04D 29/668 |
| 2018/0119701 A1* | 5/2018 | Yu | F04D 19/002 |
| 2018/0142702 A1* | 5/2018 | Gauss | F04D 17/16 |

OTHER PUBLICATIONS

JP Office Action for Application No. 2018-227998, dated Dec. 10, 2019, w/ First Office Action Summary.

* cited by examiner

SCALABLE FAN FRAME MECHANISM

CROSS REFERENCE TO RELATED APPLICATIONS

This application claims priority to U.S. Provisional Application No. 62/616,634 entitled "SCALABLE FAN FRAME MECHANISM", filed on Jan. 12, 2018, the contents of which are incorporated by reference in its entirety.

FIELD OF THE INVENTION

This application relates to cooling systems, and more particularly to a cooling system with improved airflow.

BACKGROUND

Computer server systems in modern data centers are commonly mounted in specific configurations on server racks for which a number of computing modules, such as server trays, server chassis, server sleds, server blades, etc., are positioned and stacked relative on top of each other within the server racks. Rack mounted systems allow for vertical arrangement of the computing modules to use space efficiently. Generally, each computing module can slide into and out of the server rack, and various cables such as input/output (I/O) cables, network cables, power cables, etc., connect to the computing modules at the front or rear of the rack. Each computing module contains one or more computer servers or may hold one or more computer server components. For example, computing modules includes hardware circuitry for processing, storage, network controllers, disk drives, cable ports, power supplies, etc.

In many configurations, fans in rack mounted systems are configured to move air from the front of a chassis enclosure, through the computing modules and other components, and exhaust the air out the back of the chassis enclosure. Many electronic components generate heat when operating and because of the high density of the computing modules in the chassis, so a significant amount of heat is generated by the computing modules. Therefore, the flow of air through the chassis enclosure is essential for preventing overheating of the computing modules. Accordingly, there is a significant interest in improving fan performance for computer server systems and other types of computing devices.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

A cooling system for providing streamlined airflow is provided. The system includes a fan assembly that includes an inlet side and an outlet side. The fan assembly also includes an inlet fan guard connector located at the inlet side of the fan assembly and an outlet fan guard connector located at the outlet side of the fan assembly. The fan assembly also includes a lever housings located between the inlet fan guard connector and the outlet fan guard connector and a slots oriented between the lever housings and the inlet fan guard connector and the outlet fan guard connector, the plurality of slots configured to secure an additional modular component.

In some implementations, the inlet fan guard connector is a quadrilateral shaped protrusion, where each corner includes an aperture configured to connect additional modular components. In some implementations, the outlet fan guard connector is also a quadrilateral shaped protrusion, and each corner includes an aperture configured to connect additional modular components. In some implementations, each of the lever housings include a plurality of finger levers extruding from the fan assembly. The finger levers can include receiving holes configured to secure an adjacent fan assembly. In some implementations, each of the lever housings include an aperture configured to secure additional modular components. Furthermore, each of the lever housings are connected by a planar mating surface configured to provide a mating surface with the adjacent fan assembly.

In some implementations, the cooling system also includes an inlet rim located at the inlet side of the fan assembly. The inlet rim includes a mounting points. In some implementations, the cooling system can also include an inlet bell mouth connected to the inlet rim via the mounting points, wherein the inlet bell mouth comprising a fan guard. In some implementations, the cooling system further includes an outlet rim located at the outlet side of the fan assembly. The outlet rim can include mounting points.

In some implementations, the cooling system also includes an omni-louver connected to the outlet rim via the plurality of mounting points. The omni-louver can include a spinner fairing positioned fixed within the omni-louver connected by flap members. In some implementations, each of the flap members can include a biasing element that extends from the spinner fairing to an inner surface of the omni-louver. In some implementations, the biasing element is configured to serve as a pivot so that the flap member rotates between an open position and a closed position. In some implementations, the biasing element can include a spring-loaded structure configured to respond to positive airflow from the inlet to the outlet through the fan assembly. In alternative embodiments, the biasing element includes a weight driven structure configured to respond to positive airflow from the inlet to the outlet through the fan assembly.

In some implementations, the cooling system further includes dampers. In some implementations, a first subset of the dampers is affixed to a base of the inlet fan guard connector and a second subset of the dampers is affixed to a base of the outlet fan guard connector. In some implementations, the cooling system further includes an air sealing assembly configured to connect a slot of the fan assembly. In some implementations, the air sealing assembly includes a corresponding mating configuration that secures the air sealing assembly within the slot.

In some implementations, the cooling system further includes a mating configuration. The mating configuration can be an extension of a chassis structure. The mating configuration can include an abutting point configured to secure the fan assembly within the chassis structure.

BRIEF DESCRIPTION OF THE DRAWINGS

In order to describe the manner in which the above-recited and other advantages and features of the disclosure can be obtained, a more particular description of the principles described above will be rendered by reference to specific examples illustrated in the appended drawings. These drawings depict only example aspects of the disclosure, and are therefore not to be considered as limiting of its scope The principles are described and explained with additional specificity and detail through the use of the following drawings.

DETAILED DESCRIPTION

Figure 1:
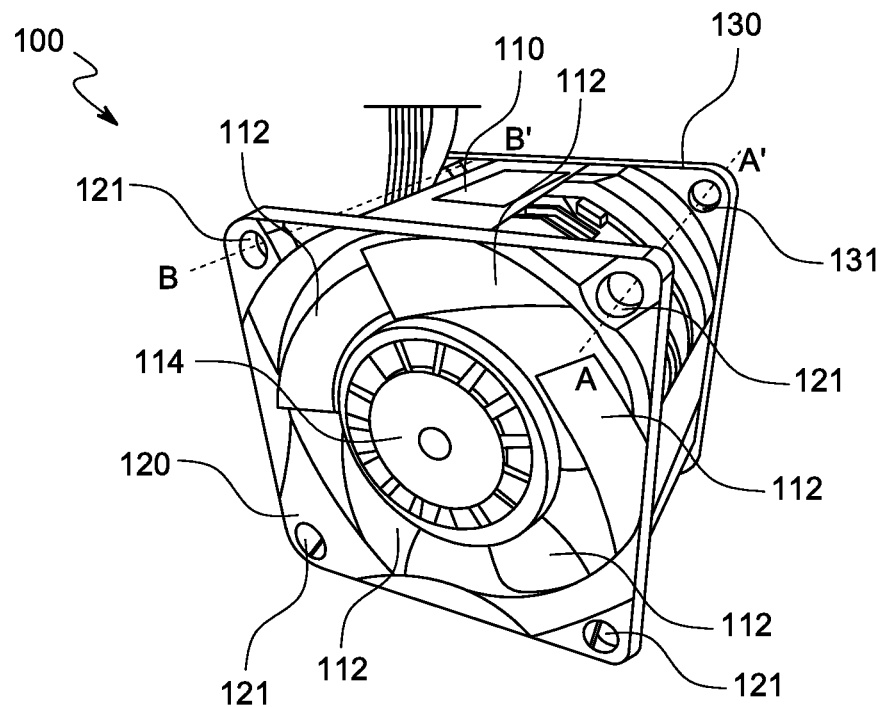
FIG. 1 illustrates a front perspective view of an exemplary conventional cooling system known in the art.

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A cooling system for providing streamlined airflow is provided. The system includes a fan assembly that includes an inlet side and an outlet side. The fan assembly also includes an inlet fan guard connector located at the inlet side of the fan assembly and an outlet fan guard connector located at the outlet side of the fan assembly. The fan assembly also includes a lever housings located between the inlet fan guard connector and the outlet fan guard connector and a slots oriented between the lever housings and the inlet fan guard connector and the outlet fan guard connector, the plurality of slots configured to secure an additional modular component.

FIG. 1 illustrates a front view of an exemplary conventional cooling system 100 as known in the prior art. The cooling system 100 includes a housing 110. The housing 110 includes an inlet fan guard connector 120 at a first end, and an outlet fan guard connector 130 at an opposite distal end of the housing 110. The inlet fan guard connector 120 and the outlet fan guard connector 130 include a number of apertures 121 and 131, respectively. The apertures 121 of the inlet fan guard are in alignment with the apertures 131 of the outlet fan guard connector 130. The alignment is represented by line A-A' and B-B'. The cooling system 100 can also include a plurality of fan blades 112 (e.g., five fan blades 112 are shown). The cooling system can also include a center fan section 114 by which each of the plurality of fan blades 112 are attached. The center fan section 114 and the plurality of fan blades 112 can be located at the inlet fan guard connector 120.

Figure 2:
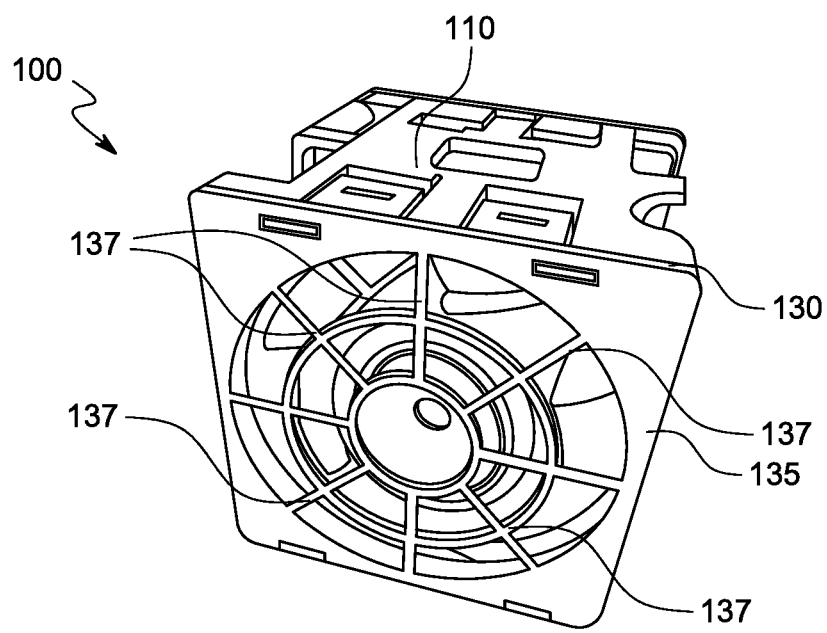
FIG. 2 illustrates a rear view of the exemplary conventional cooling system 100 of FIG. 1, as known in the prior art.

FIG. 2 illustrates a rear view of the exemplary conventional cooling system 100 of FIG. 1. A fan guard 135 is connected to the outlet fan guard connector 130. In some embodiments, the fan guard 135 is connected to the outlet fan guard connector 130 with snap connectors (not shown) that correspond with the apertures 131 (shown in FIG. 1). The fan guard 135 includes a fan strut 137. The fan strut 137 is fixed, meaning it does not rotate with the fan blades 112 (shown in FIG. 1). The cooling system 100 includes a fixed housing with very little ability for modification. In an effort to improve the performance of the cooling system 100, the housing 110 should be modifiable to include additional functionalities.

Figure 3:
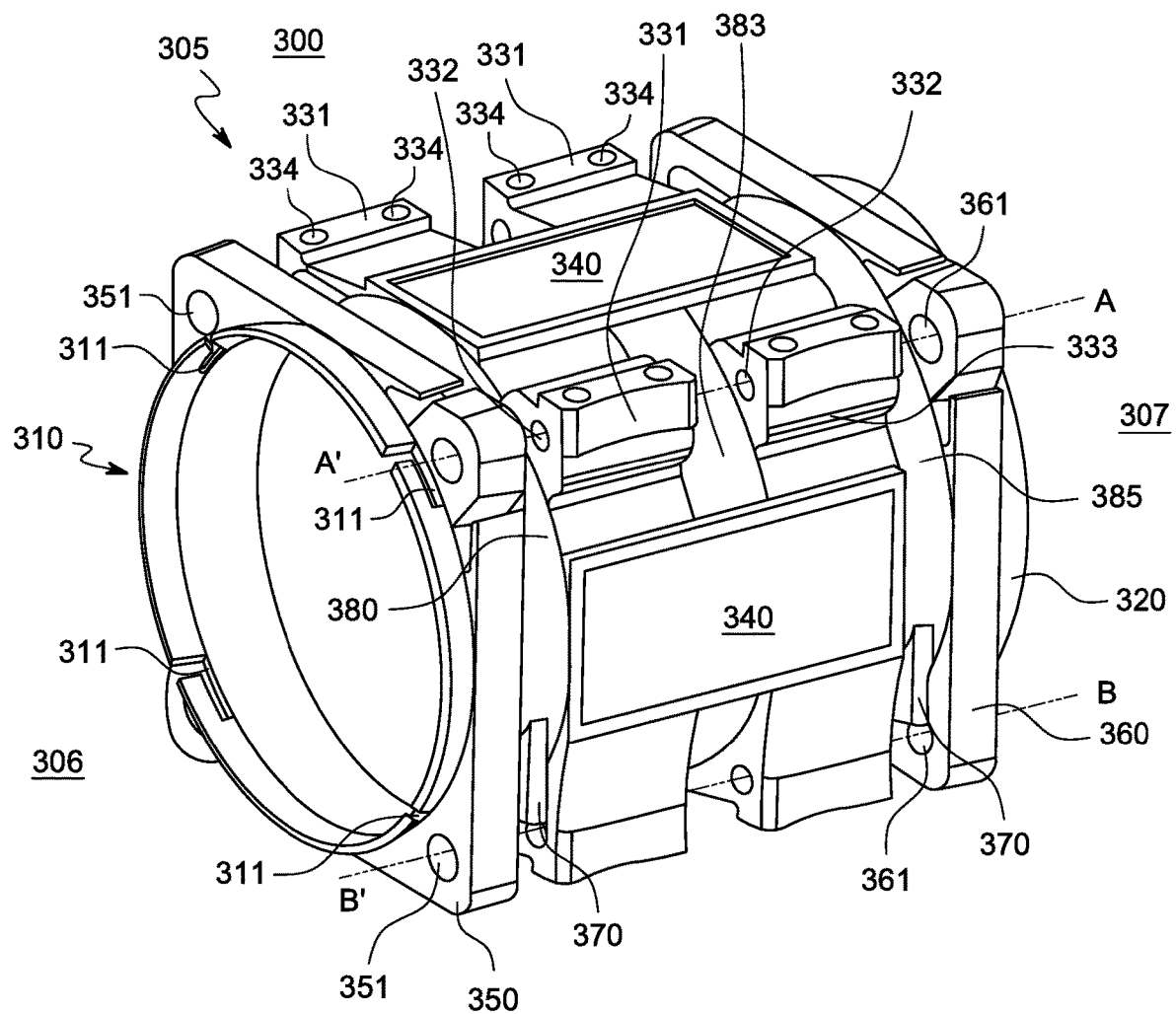
FIG. 3 illustrates a front view of an exemplary cooling system, in accordance with an embodiment of the disclosure.

FIG. 3 illustrates a front view of an exemplary cooling system 300, in accordance with an embodiment of the disclosure. The cooling system 300 can include a fan assembly 305 that includes an inlet side 306 and an outlet side 307. An inlet rim 310 can be located at the inlet side 306 of the fan assembly 305. The inlet rim 310 can include a plurality of connection slots 311 that are configured to receive an inlet component. This is discussed in greater detail with example embodiments below. The inlet side 306 of the fan assembly 305 can also include an inlet fan guard connector 350. The inlet fan guard connector 350 can be shaped as a quadrilateral. Each corner of the inlet fan guard connector 350 can include an aperture 351.

The outlet side 307 of the fan assembly 305 can include an outlet rim 320. Similar to the inlet rim 310, the outlet rim 320 can include a plurality of connection slots (not shown) that are configured to receive an outlet component. The outlet side 307 of the fan assembly can also include an outlet fan guard connector 360. The outlet fan guard connector 360 can be shaped as a quadrilateral, Each corner of the inlet fan guard connector 360 can include an aperture 361. Housed between the inlet fan guard connector 350 and the outlet fan guard connector 360 are a plurality of lever housings 333. Each lever housing 333 can include a finger lever 331, The finger lever can be extrusion extending from the fan assembly 305. The lever housing 333 can be included to improve the ergonomics of the fan assembly 305 and to further attach modular pieces to the fan assembly 305. Specifically, the finger lever 331 can include grooves to improve handling of the fan assembly 305. Each of the finger levers 331 can include receiving holes 334. The receiving holes 334 can be screw holes configured to secure an adjacent fan assembly to the disclosed fan assembly 305. For example, a second identical fan assembly can be fixed right above the fan assembly 305 where the finger levers 331 are aligned and the receiving holes 334 are aligned. A screw or other securing element can be used to secure the second identical fan assembly to the disclosed fan assembly 305. Each of the finger levers 331 can also include an aperture 332. The apertures 332 can align with the apertures 351 of the inlet fan guard connector 350 and the apertures 361 of the inlet fan guard connector 360. The apertures can be used to secure additional modular components to the fan assembly 305. This is discussed below with more detail as it relates to exemplary embodiments of FIGS. 8 and 9.

The fan assembly 305 can include a first gap 380 that separates the inlet fan guard connector 350 and a first lever housing 333. The first gap 380 can include a slot 370. The slot 370 can be utilized to adhere additional modular components to the fan assembly 305. This is discussed below with respect to exemplary embodiments shown in FIGS. 8 and 9. The first and second lever housing 333 can be separated by a second gap 383. The first and second lever housing 333 can be attached by a planar surface 340. The planar surface 340 can provide a planar mating surface for a mating fan assembly to be positioned adjacent to the fan assembly 305. The second lever housing 333 and the outlet fan guard connector 360 can be separated by a third gap 385. Similar to the first gap 380, the third gap 385 can include a slot 370 configured to adhere additional modular components to the fan assembly 305.

Figure 4:
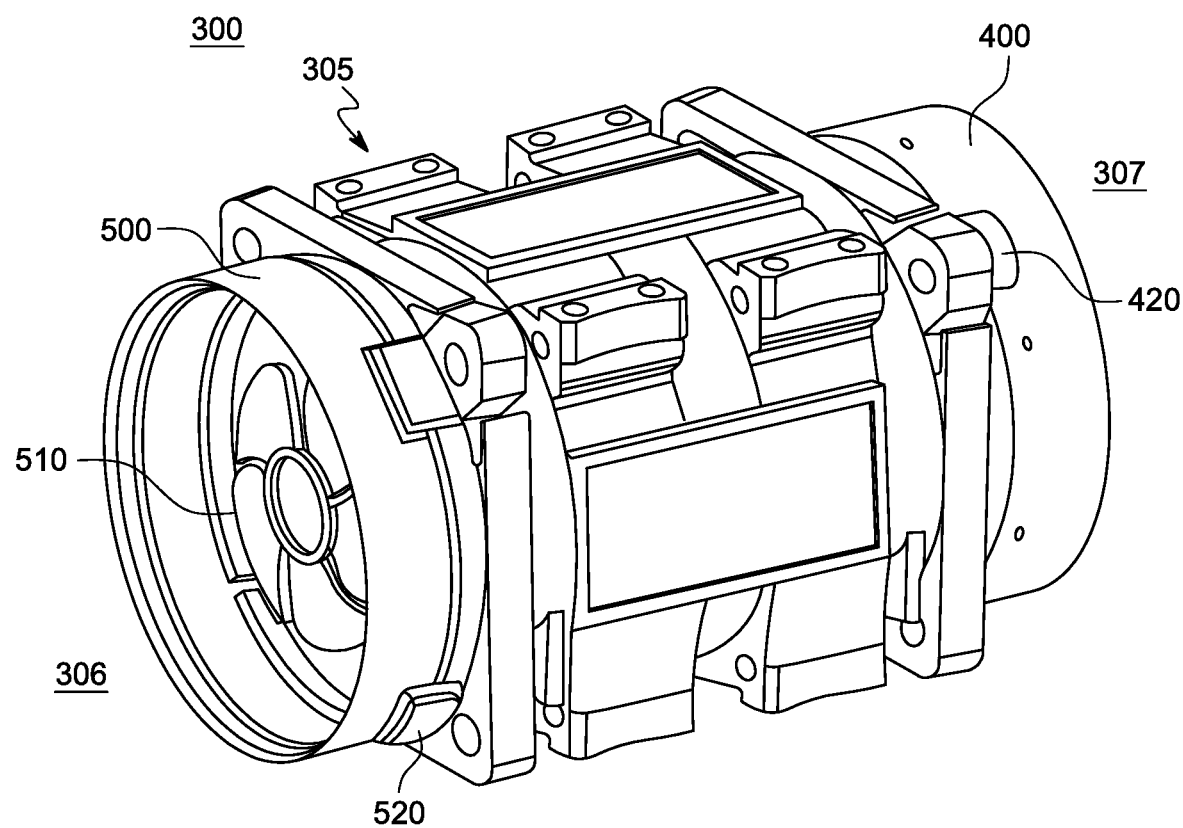
FIG. 4 illustrates a front view of an exemplary cooling system of FIG. 3 with additional modular components to enhance the functionality of the cooling system, in accordance with embodiment of the disclosure.

FIG. 4 illustrates a perspective view of an exemplary cooling system of FIG. 3, with additional modular components. The additional modular components of the cooling system 300 can be adhered to the fan assembly 305 to enhance the functionality of the cooling system 300. In some embodiments, the additional modular components can include an inlet bell mouth 500. The inlet bell mouth 500 can be located at the inlet side 306 of the fan assembly 305. The inlet bell mouth 500 can be configured to connect to the inlet rim 310. Specifically, the inlet bell mouth 500 can include a series of connection assemblies 520 that are configured to connect to the connection assembly 311 of the inlet rim 310. The inlet bell mouth 500 can include a fan guard 510. In some embodiments, the fan guard 510 can be fixed within the inlet bell mouth 500 and subsequently connected to the fan assembly 305. In alternative embodiments of the disclosure, the fan guard 510 can be directly connected to the fan assembly 305 at the inlet rim 310. In this embodiment, the inlet bell mouth 500 can attach to the fan assembly flush over the fan guard 510.

Similarly, the additional modular components can include an outlet diffuser or omni-louver 400. The omni-louver 400 can be located at the outlet side 307 of the fan assembly 305. The omni-louver 400 can be configured to connect to the outlet rim 320. Specifically, the omni-louver 400 can include a series of connection assemblies 420 that are configured to connect to a connection assembly (not shown) of the outlet rim 320.

Figure 5:
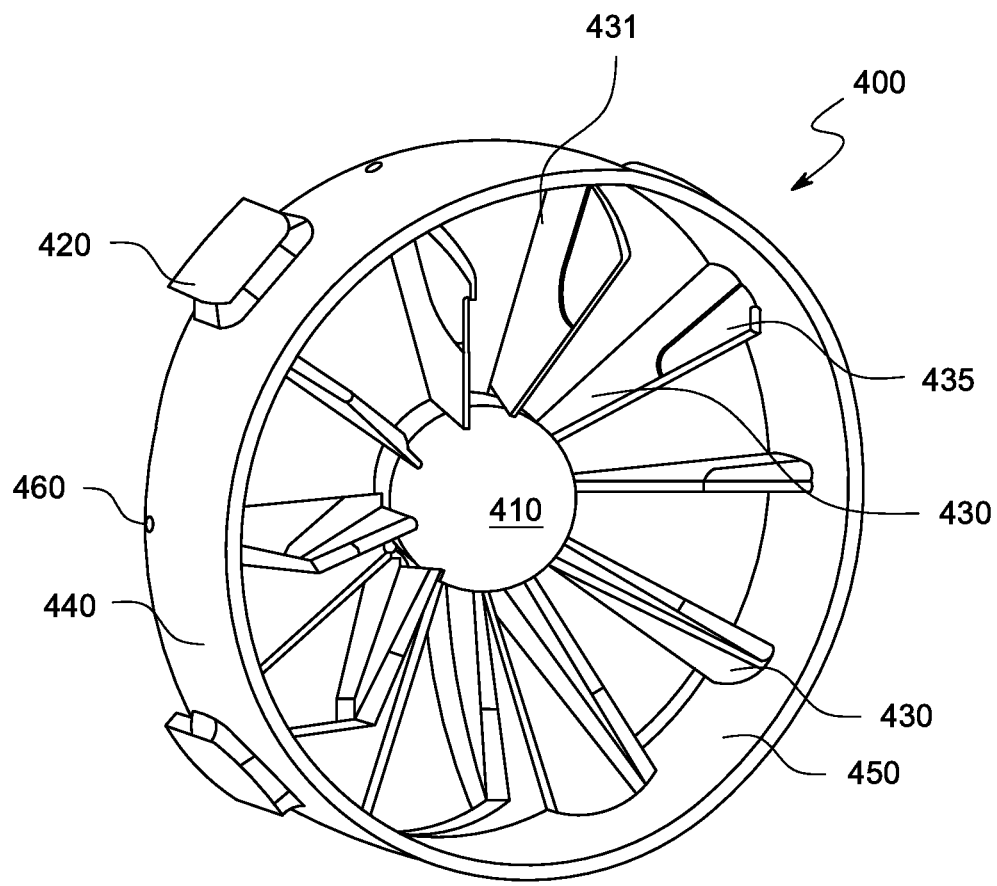
FIG. 5 illustrates a front perspective view of an omnilouver of FIG. 4 in an open condition, in accordance with an embodiment of the disclosure.
Figure 6:
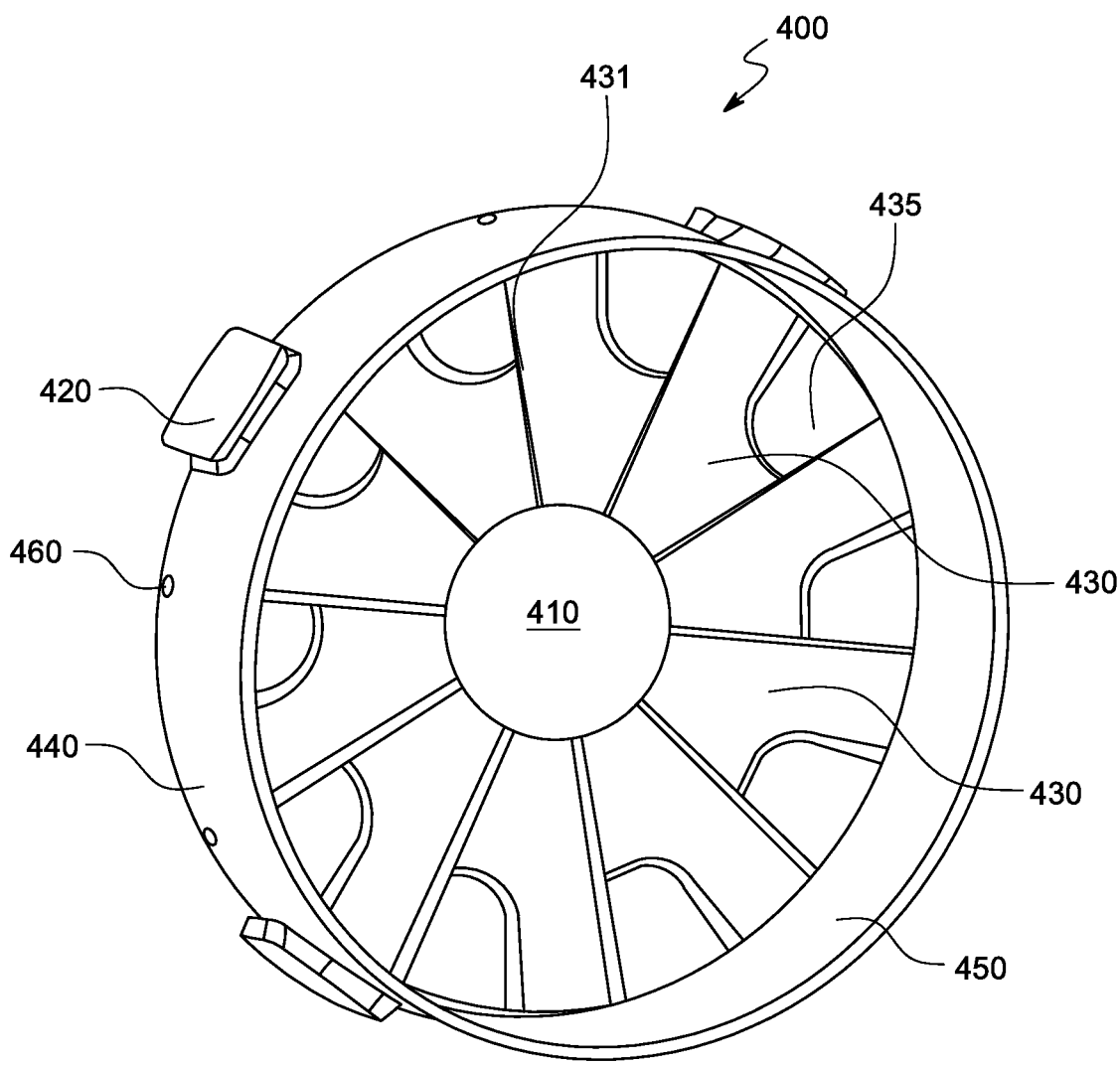
FIG. 6 illustrates a front perspective view of an omnilouver of FIG. 4 in a closed condition, in accordance with an embodiment of the disclosure.

FIG. 5 illustrates a front perspective view of an omni-louver 400 of FIG. 3 in an open condition, in accordance with an embodiment of the disclosure. Moreover, FIG. 6 illustrates a front perspective view of an omni-louver of FIG. 3 in a closed condition, in accordance with an embodiment of the disclosure. The omni-louver 400 can include an inner surface 450 and an outer surface 440. The omni-louver 400 can include a plurality of apertures that extend from the inner surface 450 to the outer surface 440. The omni louver 400 can include a spinner fairing 410. The spinner fairing 410 can be positioned fixed within the omni louver 400 connected by flap members 430. Each of the flap members 430 can include a biasing element 431 that extends from the spinner fairing 410 to the inner surface 450 of the omni louver 400. The biasing element 431 can be inserted into the aperture 460 in the omni louver 400. As a result, the flap members 430 are configured to rotate with respect to the biasing element 431 fixed into the body of the omni louver 400. The biasing elements 431 can be configured to serve as a pivot so that flap members 430 rotate between the open position shown in FIG. 5 and the closed position shown in FIG. 6.

In some implementations, the biasing elements 431 can be spring-type or spring-loaded structure configured to respond to positive airflow (from the inlet 306 to the outlet 307) through the fan assembly 305. In such configurations, the spring-type or spring-loaded structure of the biasing elements 431 can be configured to bias the flap members 430 towards their respective cutout portions. In other implementations, the biasing elements 431 can be a gravity or weight driven structure configured to respond to positive airflow through the fan assembly 305. In this embodiment, weighted portions 435 of the flap members 430 can be configured to have a higher density, and thus a higher weight, so that in the absence of positive airflow, the weighted portions 435 cause the flap members 430 to be biased towards their respective cutout portions. Any other types of biasing elements 431 can also be used without limitation. Other modules can be added to the fan assembly 305 to increase performance of the cooling system 300.

Figure 7:
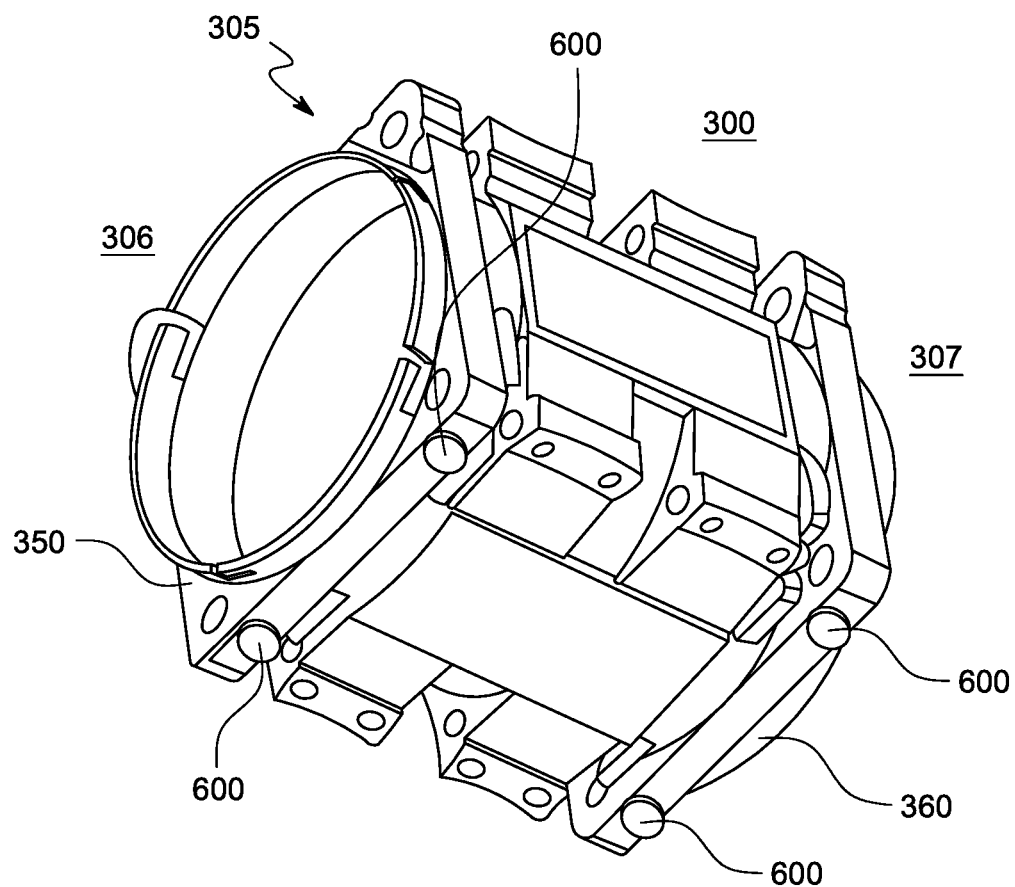
FIG. 7 illustrates a base perspective view of an exemplary cooling system of FIG. 3 with additional modular components to enhance the functionality of the cooling system, in accordance with an embodiment of the disclosure.

FIG. 7 illustrates a base perspective view of an exemplary cooling system of FIG. 3 with additional modular components. The additional modular components of the cooling system 300 can be adhered to the base of the fan assembly 305 to enhance the functionality of the cooling system 300. In some embodiments, the additional modular components can include damping materials 600. The base of the inlet fan guard connector 350 can include a receiving space configured to receive dampers 600. Similarly, the base of the outlet fan guard connector 360 can include a receiving space configured to receive dampers 600. The exemplary receiving space can include screw holes, slots, or other known mating pieces. The dampers 600 can be affixed to the base of the inlet fan guard connector 350 and the outlet fan guard connector 360 of the fan assembly 300 to reduce the amount of vibration transmitted from the cooling assembly to a server blade (not shown). The dampers 600 can be made of silicone, rubber polymers, and other elastomeric materials known in the art. For example, the dampers 600 can be a rubber grommet inserted into a mounting point (e.g., hole) in the bases of the inlet fan guard connector 350 and the outlet fan guard connector 360.

Figure 8:
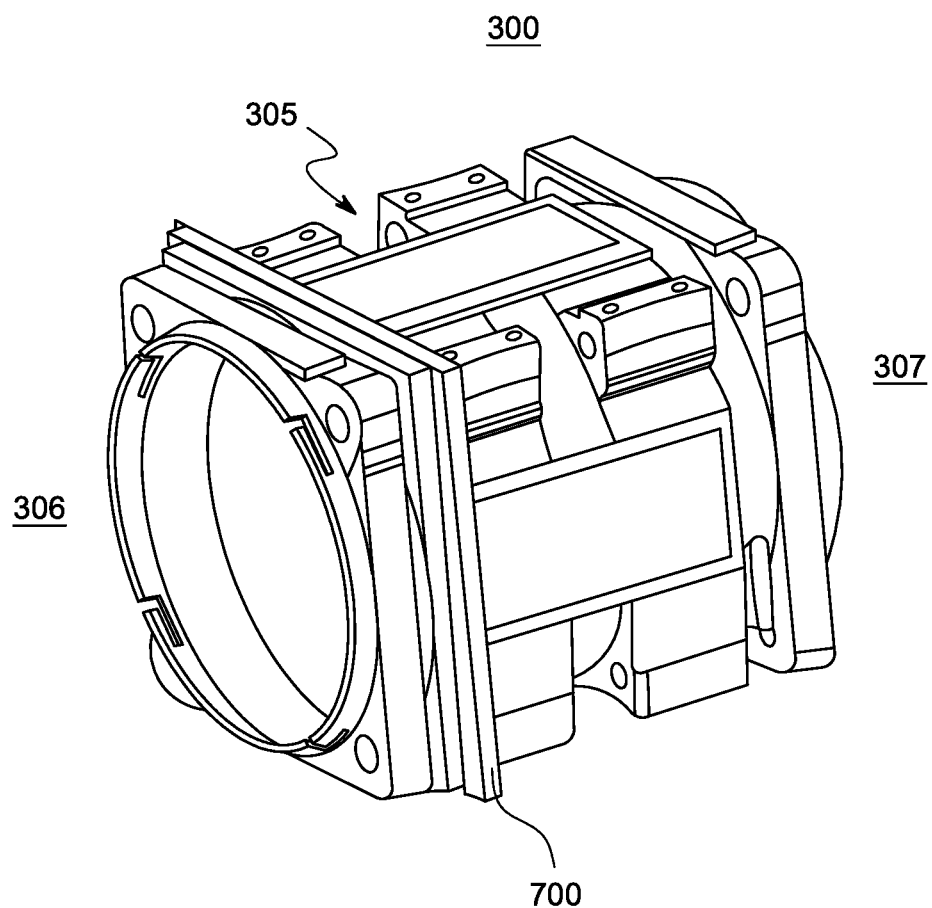
FIG. 8 illustrates an isometric perspective view of an exemplary cooling system of FIG. 3 with additional modular components to enhance the functionality of the cooling system, in accordance with an embodiment of the disclosure.
Figure 9:
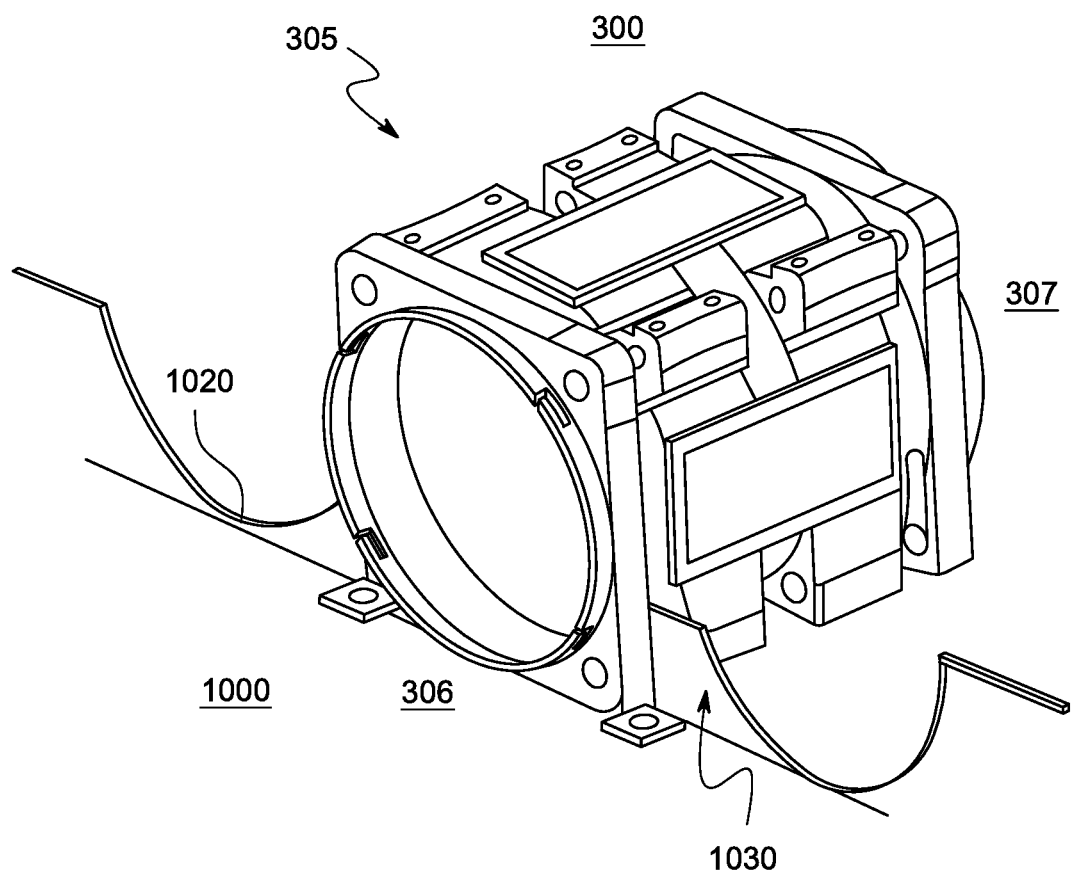
FIG. 9 illustrates an isometric perspective view of an exemplary cooling system of FIG. 3 with additional modular components to enhance the functionality of the cooling system, in accordance with an embodiment of the disclosure.

There are other mounting points on the fan assembly 305 that can be utilized to secure additional modular components. Referring momentarily back to FIG. 3, the slots 370 positioned in the first gap 380 and the third gap 385 can be implemented to assemble an air sealing assembly. FIGS. 8 and 9 illustrate a front perspective view of an exemplary cooling system of FIG. 3 with additional modular components. The additional modular components of the cooling system 300 can be adhered to the base of the fan assembly 305 to enhance the functionality of the cooling system 300. In some embodiments, the additional modular components can include an air sealing assembly 700. The air sealing assembly 700 can be adhered to the fan assembly 305 at the first gap 380. The air sealing assembly 700 can have a corresponding mating configuration that secures the air sealing assembly 700 within the slot 370. This can include for example, a corresponding protrusion configured to be secured within the first gap 380. The air sealing assembly 700 can also act as an anti-vibration structure by implementing damping material as its structure. In this embodiment, the air sealing assembly 700 not only prevents undesired airflow between two adjacent cooling assemblies, but the vibration of each cooling assembly will not act upon an adjacent cooling system or a server blade (not shown).

Referring momentarily to FIG. 9, the fan assembly 305 can he located within a chassis structure 1000. The chassis structure 1000 can include a mating configuration 1020 configured to secure the fan assembly 305. The mating configuration 1020 can include an abutting point 1030 configured to secure the fan assembly 305 within the chassis structure 1000. The abutting point 1030 can include a corresponding mating configuration that secures the abutting point 1030 within the slot 370 of the fan assembly 305. This can include for example, a corresponding protrusion configured to be secured within the first gap 380. As indicated in FIG. 9, multiple cooling systems 300 can be configured within the chassis structure 1000 aligned next to one another using this mating configuration 1020. In this way, the disclosed cooling system 300 is configured to receive additional modular components to further enhance the performance of the fan assembly with multiple functionalities.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. A cooling system for providing streamlined airflow, comprising:
a fan assembly comprising:
an inlet side and an outlet side;
an inlet fin guard connector located at the inlet side of the fan assembly;
an outlet fan guard connector located at the outlet side of the fan assembly;
a plurality of lever housings located between the inlet fan guard connector and the outlet fan guard connector, wherein each of the plurality of lever housings comprises (i) a lever aperture aligned with an aperture of the inlet fan guard or an aperture of the outlet fan guard and (ii) a finger lever comprising a plurality of receiving holes, each of the plurality of receiving holes being in a different orientation than the lever aperture; and
a plurality of slots, wherein each of the plurality of slots is oriented between the plurality of lever housings and the inlet fan guard connector and the outlet fan guard connector, the plurality of slots configured to secure an additional modular component.

2. The cooling system of claim 1, wherein the inlet fan guard connector is a quadrilateral shaped protrusion, and each corner of the inlet guard connector comprising an aperture configured to connect additional modular components.

3. The cooling system of claim 1, wherein the outlet fan guard connector is a quadrilateral shaped protrusion, and each corner of the outlet guard connector comprising an aperture configured to connect additional modular components.

4. The cooling system of claim 1, wherein the plurality of finger levers extrudes from the fan assembly, the plurality of receiving holes is configured to secure an adjacent fan assembly and are oriented orthogonal to the lever aperture.

5. The cooling system of claim 1, wherein the lever aperture is configured to secure additional modular components, wherein each of the plurality of lever housings is connected by a planar mating surface configured to provide a mating surface with an adjacent fan assembly.

6. The cooling system of claim 1, further comprising an inlet rim located at the inlet side of the fan assembly, wherein the inlet rim comprises a plurality of mounting points.

7. The cooling system of claim 6, further comprising an inlet bell mouth connected to the inlet rim via the plurality of mounting points, wherein the inlet bell mouth comprising a fan guard.

8. The cooling system of claim 1, further comprising an outlet rim located at the outlet side of the fan assembly, wherein the outlet rim comprises a plurality of mounting points.

9. The cooling system of claim 8, further comprising an omni-louver connected to the outlet rim via the plurality of mounting points comprising a spinner fairing positioned fixed within the omni-louver connected by a plurality of flap members.

10. The cooling system of claim 9, wherein each of the flap members comprising a biasing element that extends from the spinner fairing to an inner surface of the omni-louver, wherein the biasing element is configured to serve as a pivot so that the flap member rotates between an open position and a closed position.

11. The cooling system of claim 10, wherein the biasing element comprises a spring-loaded structure configured to respond to positive airflow from the inlet to the outlet through the fan assembly.

12. The cooling system of claim 10, wherein the biasing element comprises a weight driven structure configured to respond to positive airflow from the inlet to the outlet through the fan assembly.

13. The cooling system of claim 1, further comprising a plurality of dampers, wherein a first subset of the plurality of dampers is affixed to a base of the inlet fan guard connector and a second subset of the plurality of dampers is affixed to a base of the outlet fan guard connector.

14. The cooling system of claim 1, further comprising an air sealing assembly configured to connect to at least one of the plurality of slots of the fan assembly, wherein the air sealing assembly comprising a corresponding mating configuration that secures the air sealing assembly within the slot.

15. The cooling system of claim 1, further comprising a mating configuration comprising an abutting point configured to secure the fan assembly within a chassis structure.

16. A fan assembly comprising:
an inlet side and an outlet side;
an inlet fan guard connector located at the inlet side of the fan assembly, wherein the inlet fan guard connector comprises a plurality of protrusions comprising an aperture configured to connect additional modular components;
an outlet fan guard connector located at the outlet side of the fan assembly wherein the outlet fan guard connector comprises a plurality of protrusions comprising an aperture configured to connect additional modular components;

a plurality of lever housings located between the inlet fan guard connector and the outlet fan guard connector, each of the plurality of lever housings comprising (i) a lever aperture aligned with an aperture of the inlet fan guard or an aperture of the outlet fan guard and (ii) a finger lever comprising, a plurality of receiving holes, each of the plurality of receiving holes being in a different orientation than the lever aperture; and a plurality of slots, wherein each of the plurality of slots is oriented between the plurality of lever housings and the inlet fan guard connector and the outlet fan guard connector, the plurality of slots configured to secure an additional modular component.

17. The fan assembly of claim 16, wherein the plurality of finger levers extrudes from the fan assembly, and the plurality of receiving holes is configured to secure an adjacent fan assembly and is oriented orthogonal to the lever aperture.

18. The fan assembly of claim 16, wherein the lever aperture, is configured to secure additional modular components, wherein each of the plurality of lever housing is connected by a planar mating surface configured to provide a mating surface with an adjacent fan assembly.

19. The fan assembly of claim 16, further comprising an inlet rim located at the inlet side of the fan assembly, wherein the inlet rim comprises a plurality of mounting points and an outlet rim located at the outlet side of the fan assembly, wherein the outlet rim comprises a plurality of mounting points.

20. A cooling system for providing streamlined airflow, comprising:
a fan assembly comprising:
an inlet side and an outlet side;
an inlet rim located at the inlet side of the fan assembly, wherein the inlet rim comprises a plurality of mounting points;
an inlet fan guard connector located at the inlet side of the fan assembly, wherein the inlet fan guard connector is a quadrilateral shaped protrusion, and each corner of the inlet guard connector comprising an aperture configured to connect additional modular components;
an outlet rim located at the outlet side of the fan assembly, wherein the outlet rim comprises a plurality of mounting points;
an outlet fan guard connector located at the outlet side of the fan assembly, wherein the outlet fan guard connector is a quadrilateral shaped protrusion, and each corner of the outlet guard connector comprising an aperture configured to connect additional modular components;

a plurality of lever housings located between the inlet fan guard connector and the outlet fan guard connector, wherein each of the plurality of lever housing comprises a plurality of finger levers extruding from the fan assembly, each finger lever comprising (i) receiving holes configured to secure an adjacent fan assembly and (ii) a lever aperture configured to secure additional modular components, the lever aperture fan guard and oriented orthogonal to the receiving holes, wherein each of the plurality of lever housing are connected by a planar mating surface configured to provide a mating surface with the adjacent fan assembly;

a plurality of slots, wherein each of the plurality of slots is oriented between the plurality of lever housing and the inlet fan guard connector and the outlet fan guard connector, the plurality of slots configured to secure an additional modular component; and an inlet bell mouth connected to the inlet rim via the plurality of mounting points, wherein the inlet bell mouth comprising a fan guard;

an omni-louver connected to the outlet rim via the plurality of mounting points comprising a spinner fairing positioned fixed within the omni-louver connected by a plurality of flap members, wherein each of the flap members comprising a biasing element that extends from the spinner tithing to an inner surface of the omni-louver, wherein the biasing element is configured to serve as a pivot so that the flap member rotates between an open position and a closed position;

wherein the biasing element comprises a spring-loaded structure configured to respond to positive airflow from the inlet to the outlet through the fin assembly, wherein the biasing element comprises a weight driven structure configured to respond to positive airflow from the inlet to the outlet through the fan assembly, a plurality of dampers, wherein a first subset of the plurality of dampers is affixed to a base of the inlet fan guard connector and a second subset of the plurality of dampers is affixed to a base of the outlet fan guard connector;

an air sealing assembly configured to connect to at least one of the plurality of slots of the fan assembly, wherein the air sealing assembly comprising, a corresponding mating configuration that secures the air sealing assembly within the slot; and a mating configuration comprising an abutting point configured to secure the fan assembly within a chassis structure.

* * * * *